(12) United States Patent
Risaki

(10) Patent No.: US 7,768,102 B2
(45) Date of Patent: Aug. 3, 2010

(54) SEMICONDUCTOR DEVICE

(75) Inventor: Tomomitsu Risaki, Chiba (JP)

(73) Assignee: Seiko Instruments Inc. (JP)

( * ) Notice: Subject to any disclaimer, the term of this patent is extended or adjusted under 35 U.S.C. 154(b) by 201 days.

(21) Appl. No.: 11/404,934

(22) Filed: Apr. 14, 2006

(65) Prior Publication Data
US 2006/0231934 A1    Oct. 19, 2006

(30) Foreign Application Priority Data
Apr. 15, 2005 (JP) .............................. 2005-118223

(51) Int. Cl.
*H01L 29/06* (2006.01)
(52) U.S. Cl. .................. 257/622; 257/676; 257/773; 257/782; 257/786; 257/E23.015; 257/E23.039; 257/E23.151
(58) Field of Classification Search ................. 257/342, 257/622, 676, 739, 773, 786, 782, 783, E23.004, 257/E23.015, E23.039, E23.151, E23.152
See application file for complete search history.

(56) References Cited

U.S. PATENT DOCUMENTS

| | | | | |
|---|---|---|---|---|
| 6,104,062 A | * | 8/2000 | Zeng | 257/341 |
| 6,406,636 B1 | * | 6/2002 | Vaganov | 216/2 |
| 6,569,764 B1 | * | 5/2003 | Hirashima et al. | 438/673 |
| 2002/0014681 A1 | * | 2/2002 | Tsuda et al. | 257/618 |
| 2002/0104988 A1 | * | 8/2002 | Shibata et al. | 257/11 |

* cited by examiner

*Primary Examiner*—Sue Purvis
*Assistant Examiner*—Leslie Pilar Cruz
(74) *Attorney, Agent, or Firm*—Adams & Wilks

(57) ABSTRACT

A semiconductor device comprises a semiconductor chip having a rear surface provided with an uneven structure having a preselected pattern and comprised of concave and convex portions. The preselected pattern of the uneven structure is tilted so as to be in parallel to a crystal orientation of <110> of the semiconductor chip. An electrode is disposed on the concave and convex portions of the uneven structure.

17 Claims, 6 Drawing Sheets

<110>

<110>

<100>

<110>

SEMICONDUCTOR DEVICE

BACKGROUND OF THE INVENTION

1. Field of the Invention

The present invention relates to a semiconductor device to which high driving capability is required, and more particularly, to an improvement of driving capability of a transistor formed in a semiconductor device.

2. Description of the Related Art

A semiconductor device is manufactured by forming a large number of semiconductor chips on a semiconductor substrate and separating the semiconductor chips from one another to be settled in a package or the like for use. Along with development in manufacturing technology for a semiconductor device, the performance of transistors formed on a surface of the semiconductor chip has been improved in various aspects. With regard to a transistor with high driving capability, which can supply power to a load that requires large electric power, various technologies have been developed to decrease ON resistance (internal resistance of the transistor when the transistor is turned on). Currently, vertical double diffused MOS transistors (VDMOS) and trench gated MOS (UMOS) transistors, each having a structure in which electric current flows perpendicularly to the surface of a semiconductor substrate, are predominantly used for decreasing the ON resistance.

FIG. 10A is a sectional view of a semiconductor chip 009 in which a conventional transistor having high driving capability is formed. FIG. 10B is a sectional view of a conventional semiconductor device where a rear surface of the semiconductor chip 009 having a rear face electrode 004 is adhered through conductive paste 006 to a lead frame 005 that is used for packing the semiconductor chip 009. FIG. 2 is an equivalent circuit diagram (not shown in FIG. 10) of a transistor formed on an upper surface of the semiconductor chip 009 of FIG. 10. A source 016 of a transistor 011 is electrically connected to the rear surface electrode 004 of the semiconductor chip 009 via a semiconductor substrate forming the semiconductor chip 009, and power is supplied to the source 016 from the rear surface electrode 004 of the semiconductor chip 009. According to a control signal applied to a gate 014 of the transistor 011, power is supplied to a load (not shown) connected to a drain 015. Power is supplied to the source 016 of the transistor 011 of FIG. 2 from a surface 017 of the lead frame via a paste resistance 013 due to the conductive paste and a substrate resistance 012 (hereinafter the paste resistance 013 and the substrate resistance 012 are collectively referred to simply as parasitic resistance). The paste resistance 013 is the resistance of the conductive paste for adhering the semiconductor chip 009 to the lead frame 005. The substrate resistance 012 is the resistance of the semiconductor substrate which forms the semiconductor chip disposed between the rear surface electrode 004 to the source 016 of the transistor 011 and having a thickness D.

Conventionally, it was sufficient to decrease only the ON resistance, which was high as compared to the parasitic resistance, to supply high electric power to the load. However, in the above-described vertical device, despite the reduction in the ON resistance due to a development in micro fabrication technology, the parasitic resistance remains unchanged, and thus, the parasitic resistance is no longer negligible as an error in the ON resistance. In order to solve the problem, there has been adopted a back grind method for decreasing the thickness of the semiconductor substrate to decrease the substrate resistance 012 (see JP 2004-022899 A) and another method for decreasing of the paste resistance 013 through development of low resistance paste or the like (see JP 2003-016838 A).

The back grind method is to decrease the thickness D of the semiconductor substrate, as shown in FIG. 2A, but an excessive thinning in the thickness D causes lowering in the physical strength, which leads to a breaking of the semiconductor chip 009. Even if the above-described low resistance paste is used, the paste resistance 013 is more or less added serially as illustrated in FIG. 2, and thus the paste resistance can be decreased only to a certain extent. Here a problem occurs that the parasitic resistance cannot be decreased so much as compared to the ON resistance which was decreased remarkably due to the conventional art.

SUMMARY OF THE INVENTION

In order to solve the above-mentioned problem, the present invention provides the following means:

(1) A semiconductor device including a semiconductor chip having a rear surface electrode provided on a rear surface thereof, in which the rear surface of the semiconductor chip includes a uneven structure having concave and convex.

(2) A semiconductor device according to the above item (1), in which the uneven structure has a stripe pattern.

(3) A semiconductor device according to the above item (1), in which the uneven structure has a lattice pattern.

(4) A semiconductor device according to the above item (1), in which the uneven structure has a nonlinear pattern.

(5) A semiconductor device according to any one of the above items (1) to (4), in which the pattern of the uneven structure is in parallel with a crystal orientation of <100> of a semiconductor substrate.

(6) A semiconductor device including a semiconductor chip having a rear surface electrode provided on a rear surface thereof, in which a lower surface of the rear surface electrode includes an uneven structure having concave and convex.

(7) A semiconductor device according to the above item (6), in which the uneven structure has a stripe pattern.

(8) A semiconductor device according to the above item (6), in which the uneven structure has a lattice pattern.

(9) A semiconductor device according to the above item (6), in which the uneven structure has a nonlinear pattern.

(10) A semiconductor device including: a semiconductor chip having a rear surface electrode provided on a rear surface thereof; and a lead frame that is in contact with the rear surface electrode, in which a surface of the lead frame includes an uneven structure having concave and convex.

(11) A semiconductor device according to the above item (10), in which the uneven structure has a stripe pattern.

(12) A semiconductor device according to the above item (10), in which the uneven structure has a lattice pattern.

(13) A semiconductor device according to the above item (10), in which the uneven structure has a nonlinear pattern.

DETAILED DESCRIPTION OF THE PREFERRED EMBODIMENTS

Figure 1A:
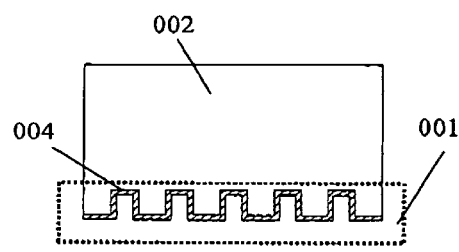
FIG. 1A is a sectional view of a semiconductor device according to a first embodiment of the present invention.
Figure 1B:
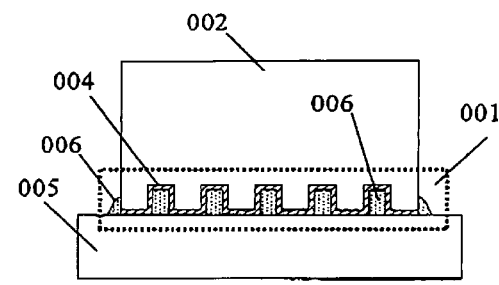
FIG. 1B is a sectional view of the semiconductor device shown in FIG. 1A adhered to a lead frame.
Figure 2:
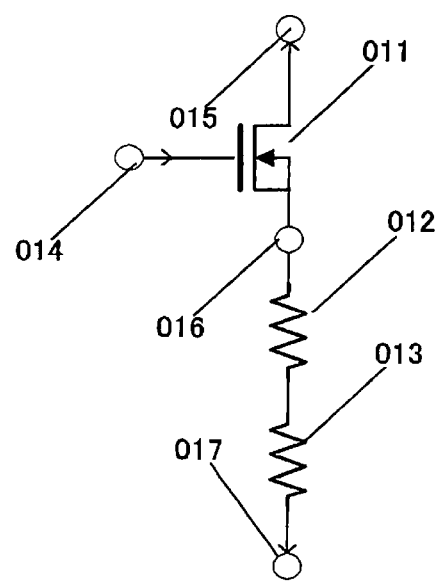
FIG. 2 is an equivalent circuit diagram of a transistor of the semiconductor device.

FIGS. 1A and 1B illustrate a first embodiment of the present invention. In FIG. 1A an uneven structure 001 having concave and convex portions is provided on a rear surface of a semiconductor chip 002 whose back side has been ground and a rear surface electrode 004 made of metal is formed on the surface of the uneven structure 001. In FIG. 1B the substrate illustrated in FIG. 1A is adhered to a lead frame 005 through conductive paste 006.

By providing the uneven structure 001 at a portion where the semiconductor chip 002 and the lead frame 005 are in contact with each other, since the substrate resistance in a direction perpendicular to a surface of the substrate is decreased the parasitic resistance can be decreased, and also the physical strength of the semiconductor chip 002 can be increased as compared to a conventional method where the back side of the semiconductor chip 009 is ground to decrease the thickness of the semiconductor chip 009 for the purpose of decreasing the substrate resistance 012. Further, in packaging, when the semiconductor chip 002 is adhered to the lead frame 005 through the conductive paste 006, the uneven structure 001 shows an effect similar to that of the tread of a tire in rain, that is as illustrated in FIG. 1B, the conductive paste 006 burrows its way into recessed portions of the uneven structure 001 allowing protruding portions of the uneven structure 001 to directly contact with the lead frame 005, which makes it possible for the semiconductor chip 002 and the lead frame 005 to contact with each other at the protruding portions without having parasitic resistance of the conductive paste 006 therebetween. Therefore, as compared with a conventional method where the thin conductive past 006 is sandwiched between the rear surface electrode 004 and the lead frame 005, the parasitic resistance is remarkably deceased.

Embodiment 1

FIGS. 1A and 1B illustrate the first embodiment of the present invention. FIG. 1A illustrates a state where, the uneven structure 001 is provided on the rear surface of the semiconductor chip 002, and the rear surface electrode 004 is formed thereon. FIG. 1B illustrates a state where the semiconductor chip 002 illustrated in FIG. 1A is adhered to the lead frame 005 through the conductive paste 006.

Figure 3:
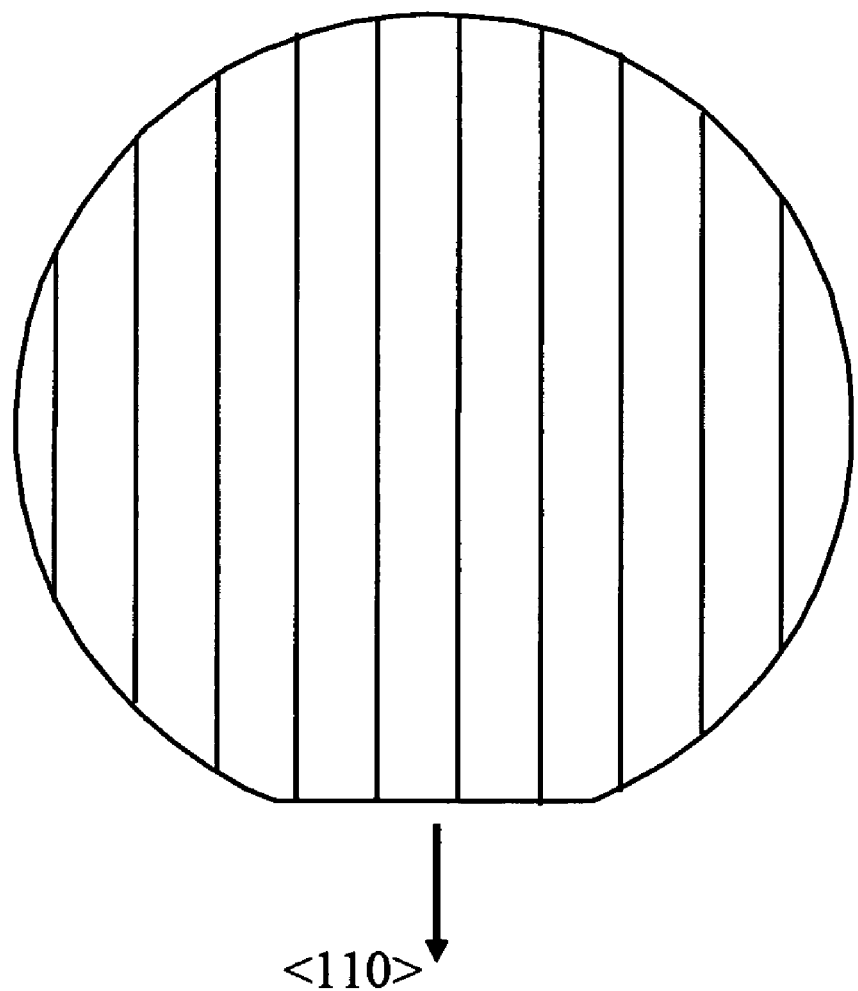
FIG. 3 is a plan view illustrating a pattern of an uneven structure according to the present invention.
Figure 4:
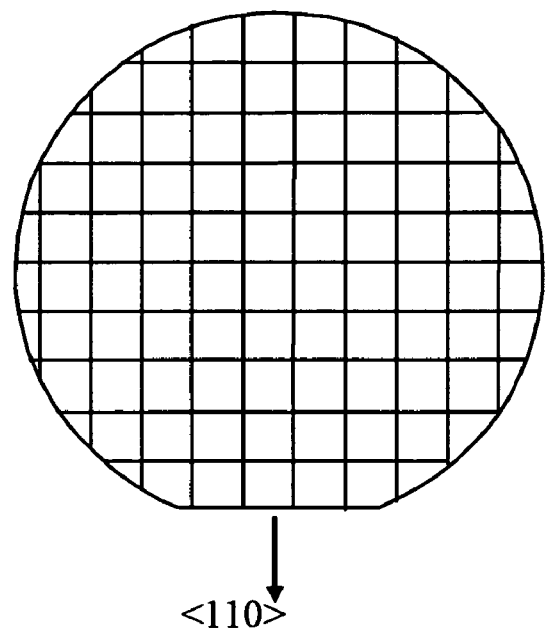
FIG. 4 is a plan view illustrating another pattern of the uneven structure according to the present invention.
Figure 5:
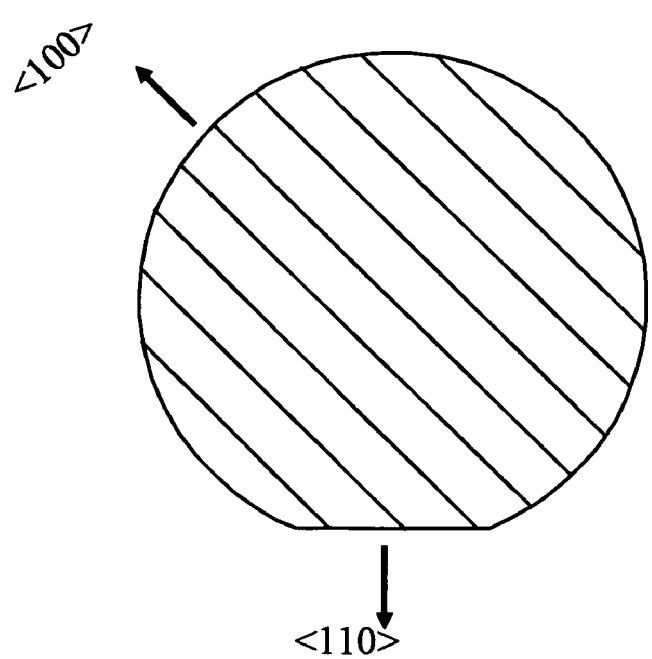
FIG. 5 is a plan view illustrating another pattern of the uneven structure according to the present invention.
Figure 6:
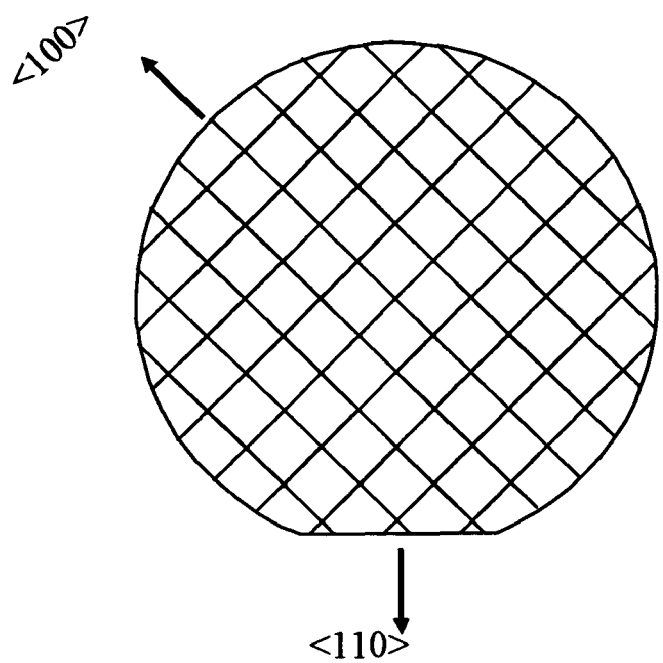
FIG. 6 is a plan view illustrating another pattern of the uneven structure according to the present invention.
Figure 7:
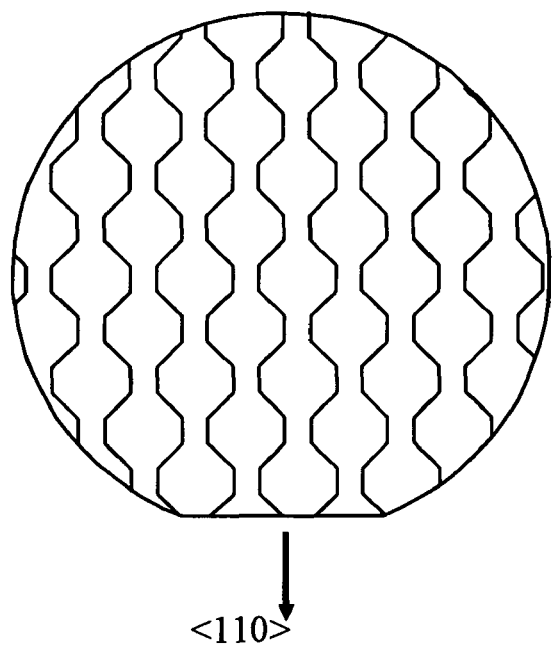
FIG. 7 is a plan view illustrating another pattern of the uneven structure according to the present invention.

FIGS. 3 and 4 are plan views of wafer-like semiconductor substrate each having a wafer flat (hereinafter referred to as WF) with a crystal orientation of <110> before being separated into semiconductor chips seen from the rear surfaces of the wafer-like semiconductor substrates with the WF the bottom. The uneven structure 001 formed on the rear surface of the semiconductor substrate is preferably in a stripe pattern as illustrated in FIG. 3 or in a lattice pattern as illustrated in FIG. 4. When the semiconductor chip 002 is required to have more physical strength, a wafer-like semiconductor substrate with a crystal orientation of <110> is used and the uneven structure 001 is tilted by 45 degrees with respect to the WF, as shown in FIG. 5 or 6, so as to be in parallel with the crystal orientation of <100>, to thereby increase the strength of the semiconductor chip more than that of the semiconductor chip 002 formed on the semiconductor substrate provided with the uneven structure 001 illustrated in FIG. 3 or FIG. 4. Further, as illustrated in FIG. 7, it is also possible to form the uneven structure 001 into wavelike lines so as to have a nonlinear pattern to further increase the strength.

Embodiment 2

Figure 8:
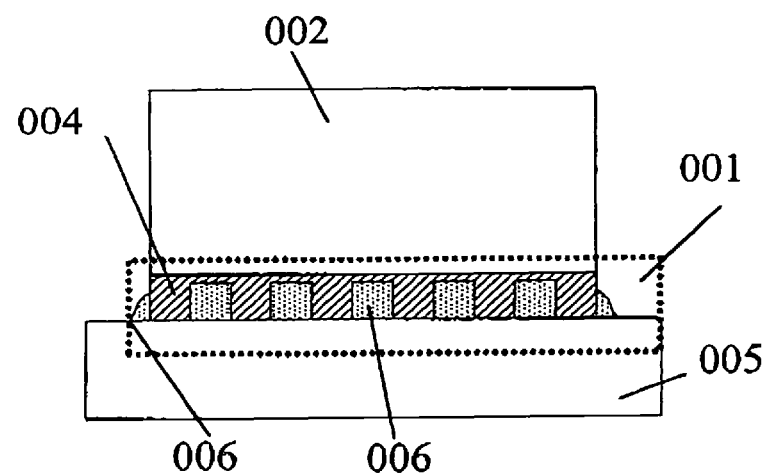
FIG. 8 is a sectional view of a semiconductor device according to a second embodiment of the present invention.

By providing the uneven structure 001 on a lower surface of the rear surface electrode which is to be in contact with the lead frame 005, as illustrated in FIG. 8, instead of on the rear surface side of the wafer-like semiconductor substrate, an effect of decreasing the parasitic resistance similar to that of Embodiment 1 can be obtained, thereby making it possible to decrease the paste resistance 013.

Embodiment 3

Figure 9:
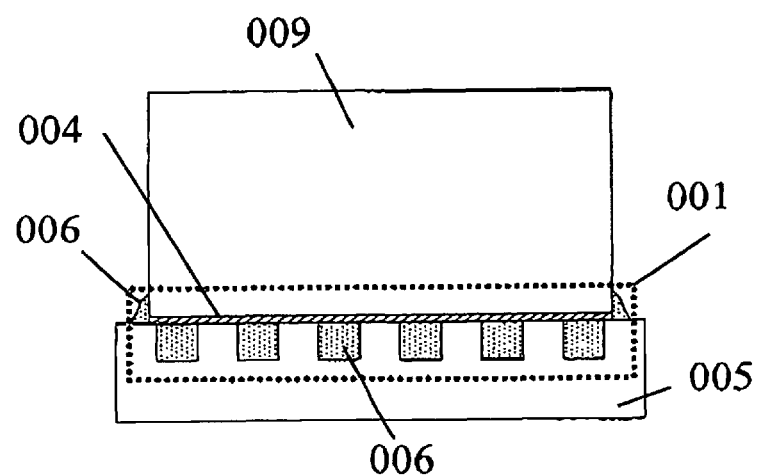
FIG. 9 is a sectional view of a semiconductor device according to a third embodiment of the present invention.
Figure 10A:
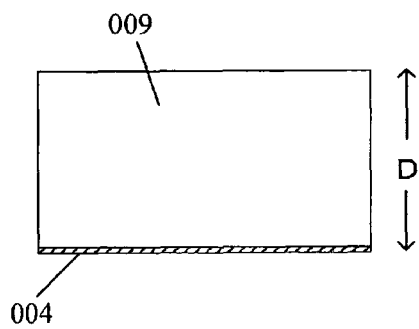
FIG. 10A is a sectional view of a conventional semiconductor device.
Figure 10B:
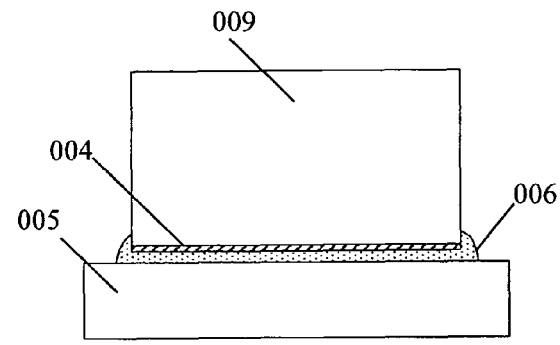
FIG. 10B is a sectional view of the semiconductor device shown in FIG. 10A attached to a lead frame.

When the substrate resistance 012 is negligible, the uneven structure 001 can be provided on an upper surface of the lead frame 005 which is to be in contact with the semiconductor chip 002 as illustrated in FIG. 9, to thereby decrease the parasitic resistance.

The present invention is not limited to the above-described embodiments, and various changes and modifications may be made within the gist of the present invention.

What is claimed is:

1. A semiconductor device comprising:
   a semiconductor chip having a rear surface and an uneven structure provided on the entire rear surface, the uneven structure having a preselected pattern and being comprised of concave and convex portions, the convex portions having surfaces forming outermost surface portions of the uneven structure, and the preselected pattern of the uneven structure being tilted so as to be parallel to a crystal orientation of <100> of the semiconductor chip;
   an electrode disposed on the concave and convex portions of the uneven structure; and
   a conductive paste disposed on the concave and convex portions of the uneven structure except for the surfaces of the convex portions forming the outermost surface portions of the uneven structure.

2. A semiconductor device according to claim 1; wherein the preselected pattern of the uneven structure is a stripe pattern.

3. A semiconductor device according to claim 1; wherein the preselected pattern of the uneven structure is a lattice pattern.

4. A semiconductor device according to claim 1; further comprising a lead frame disposed in direct contact with the surfaces of the convex portions forming the outermost surface portions of the uneven structure.

5. A semiconductor device comprising:
   a semiconductor chip having a rear surface and an uneven structure provided on the entire rear surface, the uneven structure being comprised of concave and convex portions having a preselected pattern tilted so as to be parallel to a crystal orientation of <100> of the semiconductor chip the convex portions having surfaces forming outermost surface portions of the uneven structure; a conductive paste disposed on the concave and convex portions of the uneven structure except for the surfaces of the convex portions forming the outermost surface portions of the uneven structure;

an electrode disposed on the concave and convex portions of the uneven structure of the semiconductor chip; and a lead frame disposed in direct contact with the electrode.

6. A semiconductor device according to claim 5; wherein the preselected pattern of the uneven structure is a stripe pattern.

7. A semiconductor device according to claim 5; wherein the preselected pattern of the uneven structure is a lattice pattern.

8. A semiconductor device according to claim 5; and wherein the concave and convex portions are formed from portions of the semiconductor chip.

9. A semiconductor device according to claim 8; wherein the convex portions extend into the surface of the semiconductor chip.

10. A semiconductor device according to claim 8; wherein the electrode is disposed directly on the concave and convex portions.

11. A semiconductor device comprising: a semiconductor chip having a rear surface and an uneven structure provided on the entire rear surface, the uneven structure having concave and convex portions, the convex portions having surfaces forming outermost surface portions of the uneven structure, and the uneven structure having a preselected pattern tilted so as to be parallel to both a crystal orientation of <100> of the semiconductor chip and a crystal orientation of <110> of the semiconductor chip; and an electrode disposed on the uneven structure of the semiconductor chip; and a conductive paste disposed on the concave and convex portions of the uneven structure except for the surfaces of the convex portions forming the outermost surface portions of the uneven structure.

12. A semiconductor device according to claim 11; wherein the preselected pattern of the uneven structure is a nonlinear pattern.

13. A semiconductor device according to claim 11; further comprising a lead frame disposed in direct contact with the electrode.

14. A semiconductor device according to claim 11; further comprising a lead frame disposed in direct contact with the surfaces of the convex portions forming the outermost surface portions of the uneven structure.

15. A semiconductor device according to claim 11; wherein the concave and convex portions are formed from portions of the semiconductor chip.

16. A semiconductor device according to claim 15; wherein the convex portions extend into the surface of the semiconductor chip.

17. A semiconductor device according to claim 15; wherein the electrode is disposed directly on the concave and convex portions.

\* \* \* \* \*